(12) United States Patent
Li et al.

(10) Patent No.: US 12,342,720 B2
(45) Date of Patent: Jun. 24, 2025

(54) THERMOELECTRIC GENERATOR SYSTEM AND METHOD

(71) Applicant: Rolls-Royce plc, London (GB)

(72) Inventors: Jia Li, Singapore (SG); Seok Woo Lee, Singapore (SG); Vincent B. Gill, Singapore (SG)

(73) Assignee: Rolls-Royce plc, London (GB)

( * ) Notice: Subject to any disclaimer, the term of this patent is extended or adjusted under 35 U.S.C. 154(b) by 116 days.

(21) Appl. No.: 18/244,774

(22) Filed: Sep. 11, 2023

(65) Prior Publication Data

US 2024/0114790 A1  Apr. 4, 2024

(30) Foreign Application Priority Data

Sep. 29, 2022  (GB) ..................................... 2214251

(51) Int. Cl.
*H10N 10/13* (2023.01)
*F01D 15/10* (2006.01)
*F02C 6/08* (2006.01)
*H10N 10/17* (2023.01)

(52) U.S. Cl.
CPC ............. *H10N 10/13* (2023.02); *F01D 15/10* (2013.01); *F02C 6/08* (2013.01); *H10N 10/17* (2023.02); *F05D 2260/606* (2013.01)

(58) Field of Classification Search
CPC ........ H10N 10/13; H10N 10/17; F01D 15/10; F02C 6/08; F02C 7/12; F05D 2260/606; F05D 2260/20; F05D 2260/60; F05D 2260/76; F25B 9/04
See application file for complete search history.

(56) References Cited

U.S. PATENT DOCUMENTS

| 11,454,171 | B1 | 9/2022 | Rutledge et al. |
| 2008/0029624 | A1 | 2/2008 | Shkolnikov et al. |
| 2020/0386140 | A1 | 12/2020 | An et al. |

FOREIGN PATENT DOCUMENTS

| CN | 204517455 U | 7/2015 |
| CN | 210463662 U | 5/2020 |
| EP | 3032190 A1 | 6/2016 |

(Continued)

OTHER PUBLICATIONS

Im, KR-101836004-B1 Machine Translation (Year: 2018).*

(Continued)

*Primary Examiner* — Devina Pillay

(57) ABSTRACT

A thermoelectric generator system comprising a thermoelectric generator, a vortex tube for receiving a compressed gas from a flow input and separating the compressed gas into a hot flow exiting a first output and a cold flow exiting a second output, a sensor system for determining a first parameter, a second parameter, and a third parameter, the third parameter being indicative of a temperature of a third fluid flow, a radiator system comprising a first and second heat exchangers disposed on opposing sides of the thermoelectric generator; a tube system to separately direct the hot, cold, and third fluid flows towards a switch arrangement configured to be moveable between a first configuration, a second configuration, and a third configuration, with a control unit for controlling the switch arrangement based on the first, second, and third parameter.

20 Claims, 6 Drawing Sheets

(56) References Cited

FOREIGN PATENT DOCUMENTS

KR    101836004 B1 *  4/2018
WO    2021053327 A1   3/2021

OTHER PUBLICATIONS

Van Heerden, A. S. J., et al, Aircraft Thermal Management: Practices, technology, system architectures, future challenges and opportunities, ELSEVIERProgress in Aerospace Sciences, OxfordXP86911079Adoi: 10.1016/J.PAEROSCI.2021.100767, Nov. 12, 2021.
European search report dated Feb. 1, 2024, issued in EP Patent Application No. 2193844.0.
Great Britain search report dated Mar. 13, 2023, issued in GB Patent Application No. 2214251.7.

* cited by examiner

THERMOELECTRIC GENERATOR SYSTEM AND METHOD

CROSS-REFERENCE TO RELATED APPLICATIONS

This specification is based upon and claims the benefit of priority from United Kingdom patent application GB 2214251.7 filed on Sep. 29, 2022, the entire contents of which is incorporated herein by reference.

BACKGROUND

Technical Field

The present disclosure relates to a thermoelectric generator system, a method of controlling a thermoelectric generator system, and a gas turbine engine.

Description of the Related Art

Thermoelectric generator systems are known to produce a voltage when in the presence of a thermal gradient. Placing thermoelectric generators in places with a high thermal gradient, such as on a compressor casing of a gas turbine engine, can result in losses, for example, in thrust.

SUMMARY

According to a first aspect there is provided a thermoelectric generator system comprising:
a thermoelectric generator;
a vortex tube comprising a flow input configured to receive an input of compressed gas and to separate the compressed gas into a hot flow discharged from a first output of the vortex tube, and a cold flow discharged from a second output of the vortex tube;
a sensor system configured to determine a first parameter indicative of a temperature of the hot flow, a second parameter indicative of a temperature of the cold flow and a third parameter indicative of a temperature of a third fluid flow;
a radiator system comprising:
  a first heat exchanger and a second heat exchanger disposed on opposing sides of the thermoelectric generator; and
  a tube system configured to separately direct the hot flow, the cold flow and the third fluid flow towards a switch arrangement, wherein the switch arrangement is configured to receive each of the hot flow, the cold flow and the third fluid flow, and to be moveable between:
    a first configuration in which the cold flow is directed to the second heat exchanger and the hot flow is directed to the first heat exchanger;
    a second configuration in which the cold flow is directed to the second heat exchanger and the third fluid flow is directed to the first heat exchanger; and
    a third configuration in which the third fluid flow is directed to the second heat exchanger and the hot fluid is directed to the first heat exchanger;
the thermoelectric generator system further comprising a control unit configured to control the configuration of the switch arrangement based on the first parameter, the second parameter, and the third parameter.

The first output of the vortex tube is designed to discharge a flow having a higher temperature than the flow discharged from the second output of the vortex tube. Therefore, references to hot flow and cold flow are hot and cold relative to one another. In other words, the cold flow has a lower temperature than the hot flow, and the hot flow has a higher temperature than the cold flow.

The radiator system may be disposed between the vortex tube and the thermoelectric generator.

The third fluid flow may be an ambient fluid flow around the thermoelectric generator, around the vortex tube, around the sensor system, around the radiator system or from any other suitable place, such as bleed air from the compressor stage of a gas turbine engine.

It may be that the thermoelectric generator is electrically connected to the control unit, so that the control unit is powered by the thermoelectric generator.

It may be that thermoelectric generator system further comprises an energy storage component electrically connected to the thermoelectric generator to store energy generator by the thermoelectric generator that cannot be immediately consumed.

It may be that, in the third configuration, the switch arrangement is configured to direct the cold flow to a component heat exchanger at an electronic component which is powered by the thermoelectric generator, to cool the electronic component.

It may be that the radiator system is configured so that fluid directed through the second heat exchanger is directed to a component heat exchanger at an electronic component which is powered by the thermoelectric generator, to cool the electronic component.

The electronic component may be a sensor. The sensor may include any of: an accelerometer, a temperature sensor, a pressure sensor a location sensor, an orientation sensor, a humidity sensor, a vibration sensor, an air quality sensor and/or a gas sensor. The electronic component may additionally or alternatively include a battery, control electronics, data logging electronics and wireless communication electronics. The electronic components may require power in the order of mW up to approximately 10 W. For example, a pressure sensor may require approximately 15 mW of power, while a datalogger may require 4-5 W of power.

The thermoelectric generator may be a p/n type thermoelectric generator. The thermoelectric generator may comprise a plurality of p/n type thermoelectric modules. The p/n type thermoelectric modules may be connected in series. This enables the voltage output of the thermoelectric generator to be increased.

It may be that the control unit is configured to control the switch arrangement to move to the first configuration when the cold flow has a lower temperature than the third fluid flow, and optionally when the third fluid flow has a lower temperature than the hot flow.

It may be that the control unit is configured to control the switch arrangement to move to the second configuration when the hot flow has a lower temperature than the third fluid flow, and optionally when the third fluid flow has a higher temperature than the cold flow.

It may be that the control unit is configured to control the switch arrangement to move to the third configuration when the third fluid flow has a lower temperature than the cold flow.

According to a second aspect, there is provided a gas turbine engine comprising a thermoelectric generator system according to the first aspect.

The gas turbine engine may comprise:

a compressor stage; and a bleed air line diverted from the compressor stage;

wherein the flow input of the vortex tube is fluidically connected to the bleed air line to receive compressed fluid from the bleed air line.

The hot flow and/or the cold flow may be directed back to join the bleed air from the bleed air line after passing through the radiator system. The temperature of the bleed air is thereby increased when the hot flow or both flows are added, thus improving it's heating capacity, for example for wing de-icing, or reduced when the cold flow is added, thereby reducing the requirement to cool the air, for example when conditioning cabin air.

The hot flow may be directed to the first heat exchanger and the cold flow may be directed to the second heat exchanger.

According to a third aspect, there is provided an aircraft comprising a gas turbine engine according to any of the preceding aspects.

According to a fourth aspect, there is provided a method of controlling the thermoelectric generator system according to the first aspect, the method comprising:

monitoring a parameter indicative of the temperature of the hot flow, the cold flow and the third fluid flow with the sensor system to determine the first parameter, the second parameter and the third parameter respectively; and controlling the configuration of the switch arrangement based on the first parameter, the second parameter and the third parameter.

It may be that the method comprises powering the control unit with the thermoelectric generator.

It may be that the method further comprises directing the energy generated by the thermoelectric generator that cannot be immediately consumed to an energy storage component.

It may be that, in the third configuration, the cold flow is directed to the component heat exchanger at the electronic component which is powered by the thermoelectric generator, to cool the electronic component.

It may be that fluid which has passed through the second heat exchanger is directed to the component heat exchanger at the electronic component which is powered by the thermoelectric generator, to cool the electronic component.

It may be that the method comprises controlling the switch arrangement to move to the first configuration when the cold flow has a lower temperature than the third fluid flow, and optionally when the third fluid flow has a lower temperature than the hot flow.

It may be that the method comprises controlling the switch arrangement to move to the second configuration when the hot flow has a lower temperature than the third fluid flow, and optionally when the third fluid flow has a higher temperature than the cold flow.

It may be that the method comprises controlling the switch arrangement to move to the third configuration when the third fluid flow has a lower temperature than the cold flow.

The skilled person will appreciate that except where mutually exclusive, a feature described in relation to any one of the above aspects may be applied mutatis mutandis to any other aspect. Furthermore, except where mutually exclusive any feature described herein may be applied to any aspect and/or combined with any other feature described herein.

DESCRIPTION OF THE DRAWINGS

Embodiments will now be described by way of example only, with reference to the Figures, in which.

DETAILED DESCRIPTION

Figure 1:
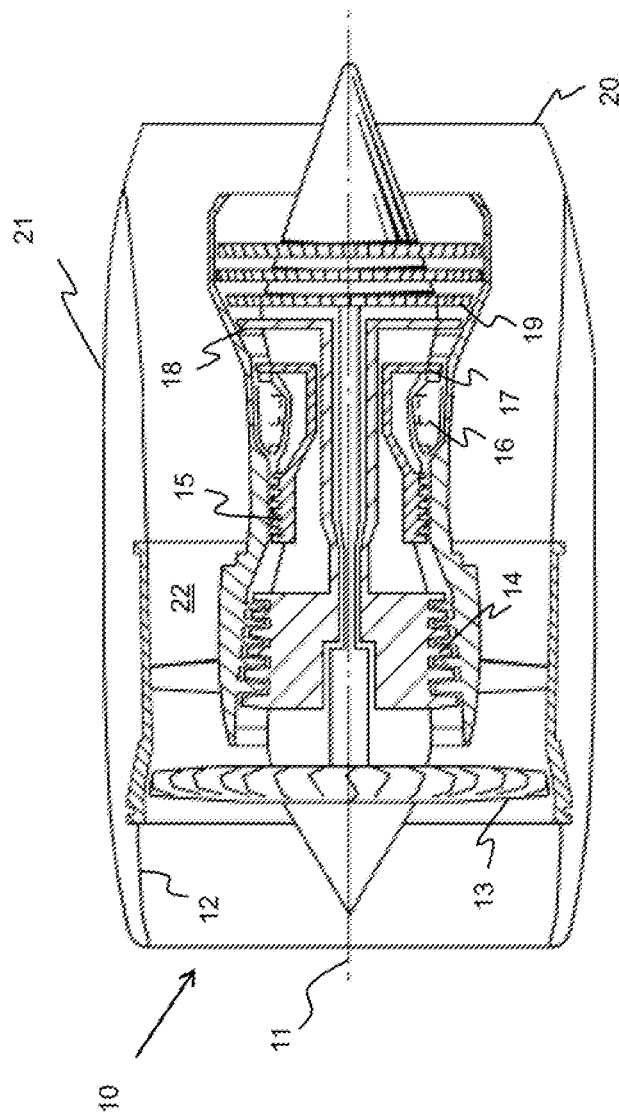
FIG. 1 is a sectional side view of a gas turbine engine.

With reference to FIG. 1, a gas turbine engine for an aircraft is generally indicated at 10, having a principal and rotational axis 11. The engine 10 comprises, in axial flow series, an air intake 12, a propulsive fan 13, a compressor stage comprising an intermediate pressure compressor 14, a high-pressure compressor 15, combustion equipment 16, a high-pressure turbine 17, an intermediate pressure turbine 18, a low-pressure turbine 19 and an exhaust nozzle 20. A nacelle 21 generally surrounds the engine 10 and defines both the intake 12 and the exhaust nozzle 20.

The gas turbine engine 10 works in the conventional manner so that air entering the intake 12 is accelerated by the fan 13 to produce two air flows: a first air flow into the intermediate pressure compressor 14 and a second air flow which passes through a bypass duct 22 to provide propulsive thrust. The intermediate pressure compressor 14 compresses the air flow directed into it before delivering that air to the high pressure compressor 15 where further compression takes place.

The compressed air exhausted from the high-pressure compressor 15 is directed into the combustion equipment 16 where it is mixed with fuel and the mixture combusted. The resultant hot combustion products then expand through, and thereby drive the high, intermediate and low-pressure turbines 17, 18, 19 before being exhausted through the nozzle 20 to provide additional propulsive thrust. The high 17, intermediate 18 and low 19 pressure turbines drive respectively the high pressure compressor 15, intermediate pressure compressor 14 and fan 13, each by suitable interconnecting shaft.

Other gas turbine engines to which the present disclosure may be applied may have alternative configurations. By way of example such engines may have an alternative number of interconnecting shafts (e.g. two) and/or an alternative number of compressors and/or turbines. Further the engine may comprise a gearbox provided in the drive train from a turbine to a compressor and/or fan.

Figure 2:
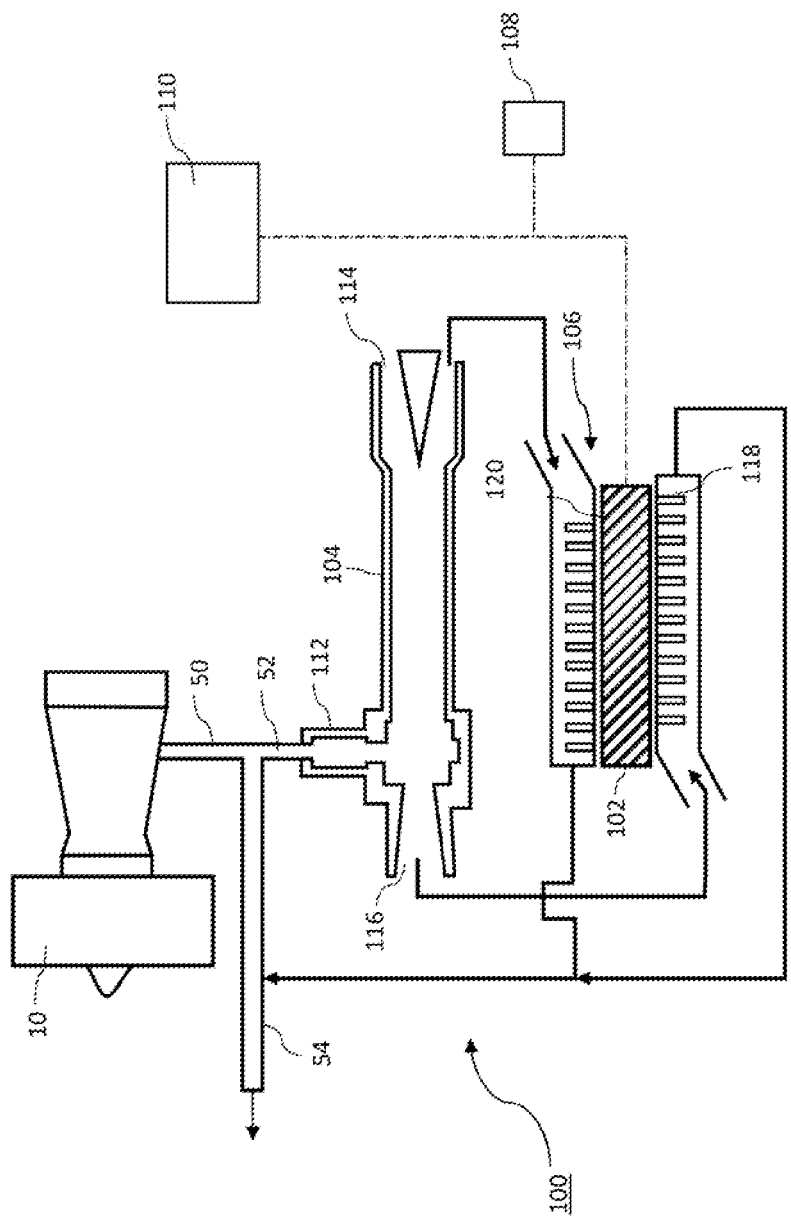
FIG. 2 schematically shows a first example thermoelectric generator system in the gas turbine engine.

FIG. 2 shows a schematic representation of the gas turbine engine 10 comprising a first example thermoelectric generator system 100 connected to the compressor stage via a bleed air line 50 which is diverted from the compressor stage of the gas turbine engine 10.

In this example, the bleed air line 50 is bifurcated into two lines, with a first line 52 being configured to deliver compressed air to the thermoelectric generator system 100, and a second line 54 being configured to receive compressed air from the thermoelectric generator system 100. In some examples, the bleed air line may not bifurcate, and may simply be configured to deliver compressed air to the thermoelectric generator system without receiving the compressed air back again. In other examples, compressed air is delivered to the thermoelectric generator system 100 by other means, and the bleed air line may be configured to receive compressed air from the thermoelectric generator system. In yet other examples, the thermoelectric generator system may not receive or deliver air to the bleed air line, and may be completely independent from the bleed air diverted from the compressor stage.

The first example thermoelectric generator system 100 comprises a thermoelectric generator 102, a vortex tube 104 and a radiator system 106 which may be disposed between the vortex tube 104 and the thermoelectric generator 102.

The thermoelectric generator 102 generates a potential difference by a temperature gradient across the thermoelectric generator 102. In this example, the thermoelectric generator 102 is a p/n type thermoelectric generator which comprises a plurality of p/n type thermoelectric modules. Each thermoelectric module may be able to produce approximately 0.05-1 W. The p/n type thermoelectric modules can be connected in series which enables the voltage output (and wattage) of the thermoelectric generator 102 to be increased by adding the wattages of each thermoelectric module connected in series.

In this example, the thermoelectric generator 102 is electrically coupled to electronic components to power the electronic components. In this example, the electronic components comprise a sensor 108, and an energy storage component 110 such as a battery or capacitor, to store energy generated by the thermoelectric generator 102 that cannot be immediately consumed. In some examples, the thermoelectric generator 102 may not be connected to any components, but may be configured to be connected to such components. In other examples, the thermoelectric generator may be configured to be, or may be, coupled to a single electric component, or more than two electric components.

The sensor may include any of: an accelerometer, a temperature sensor, a pressure sensor, a location sensor, an orientation sensor, a humidity sensor, a vibration sensor, an air quality sensor and/or a gas sensor. The electronic component may additionally or alternatively include control electronics, data logging electronics and/or wireless communication electronics. The electronic components may require power in the order of mW up to approximately 10 W. For example, a pressure sensor may require approximately 15 mW of power, while a datalogger may require 4-5 W of power.

The vortex tube 104 comprises a flow input 112 which is configured to receive an input of compressed gas. In this example, the flow input 112 is fluidically connected to the first line 52 of the bleed air line 50, such that it receives compressed gas from the compressor stage of the gas turbine engine 10. The vortex tube 104 is configured to separate the compressed gas into a hot flow and a cold flow, with the hot flow and cold flow being hot and cold relative to one another. In other words, the cold flow has a lower temperature than the hot flow, and the hot flow has a higher temperature than the cold flow. The vortex tube 104 is configured to achieve this separation without additional energy input. The hot flow is discharged from a first output 114 of the vortex tube 104 and the cold flow is discharged from the second output 116 of the vortex tube 104.

The radiator system 106 in this example comprises a first heat exchanger 120 and a second heat exchanger 118 which are disposed on opposing sides of the thermoelectric generator 102. In this example, the cold flow is directed to the second heat exchanger 118 and the hot flow is directed to the first heat exchanger 120. Since the thermoelectric generator 102 generates a potential difference and electric current by a temperature gradient across the thermoelectric generator 102, by splitting compressed air into a hot flow and a cold flow with the vortex tube 104, the thermal gradient across the thermoelectric generator 102 can be increased without requiring additional power input, thus increasing the power output of the thermoelectric generator 102. In particular this allows for the thermoelectric generator to operate in an otherwise isothermal environment. This provides greater flexibility in the placement of the energy harvesting system.

In other examples, only the cold flow may be directed to the second heat exchanger 118 or only the hot flow may be directed to the first heat exchanger 120. In such examples, the ambient surroundings may be sufficient to provide the other of the second heat exchanger or first heat exchanger with the required temperature gradient to produce a voltage across the thermoelectric generator 102.

In this example, after passing through the second heat exchanger 118 and the first heat exchanger 120, the cold flow and the hot flow are directed back to join the bleed air from the compressor stage at the second line 54 of the bleed air line 50. While passing through the first heat exchanger 120, the hot flow may have become hotter or cooler due to the ambient surroundings of the gas turbine engine in which the thermoelectric generator has been placed. The cold flow may also have become hotter for the same reasons. Therefore, adding the hot flow and the cold flow back to the bleed air may improve its heating capacity, for example for de-icing a wing of an aircraft. In other examples, only the hot flow may be returned to the bleed air to increase the temperature of the bleed air. In yet further examples, only the cold flow may be returned to the bleed air, which may cool the bleed air, thereby reducing a requirement to cool the air, for example when using bleed air for conditioning cabin air of an aircraft.

Figure 3:
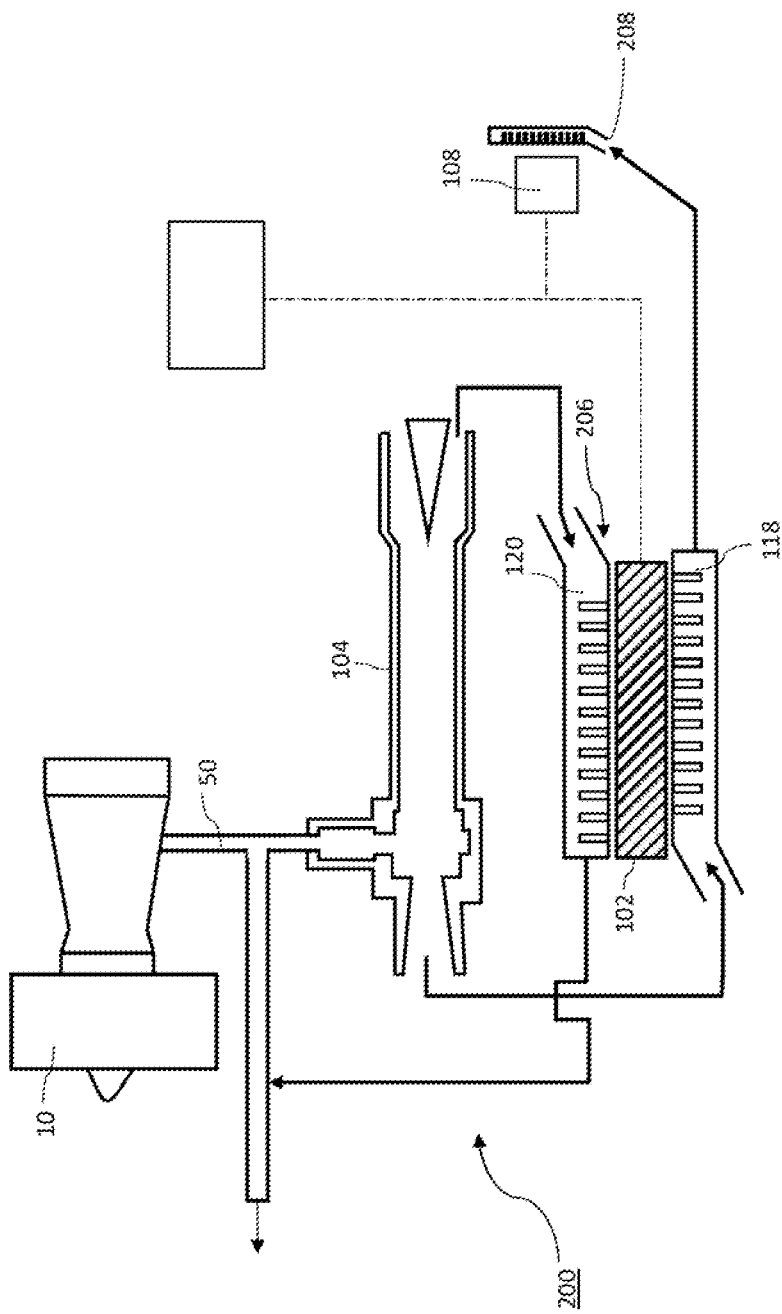
FIG. 3 schematically shows a second example thermoelectric generator system in the gas turbine engine.

FIG. 3 shows the gas turbine engine 10 comprising a second example thermoelectric generator system 200 connected to the compressor stage via a bleed air line 50 which is diverted from the compressor stage of the gas turbine engine 10.

The second example thermoelectric generator system 200 is similar to the first example thermoelectric generator system 100 described with reference to FIG. 2, with like reference numerals denoting like components. The second example thermoelectric generator system 200 differs from the first example thermoelectric generator system 100 in that it has a different radiator system 206.

The radiator system 206 in this example still comprises a first heat exchanger 120 and a second heat exchanger 118 which are disposed on opposing sides of the thermoelectric generator 102, but in this example, once the cold flow has passed through the second heat exchanger 118, it is directed to at least one of the electronic components to cool them. In this example, FIG. 3 shows a component heat exchanger 208 at the sensor 108, which is configured to receive the cold flow from the second heat exchanger 118. Providing the cold flow to the component heat exchanger 208 after it has passed through the second heat exchanger 118 improves the electric generation capacity of the thermoelectric generator 102, since the cold flow is as cold as possible, since it has not been heated by passing through another heat exchanger.

In other examples, the cold flow may be directed to cool the sensor 108 or other electronic components before being provided to the second heat exchanger 118.

In this second example thermoelectric generator system 200, the cold flow is used to cool the same electronic components which are powered by the thermoelectric generator 102, such that the electronic components are cooled more efficiently and effectively than, for example, simply using bleed air or ambient air, without the requirement for additional energy inputs or additional heat exchangers or cooling flows.

Figure 4:
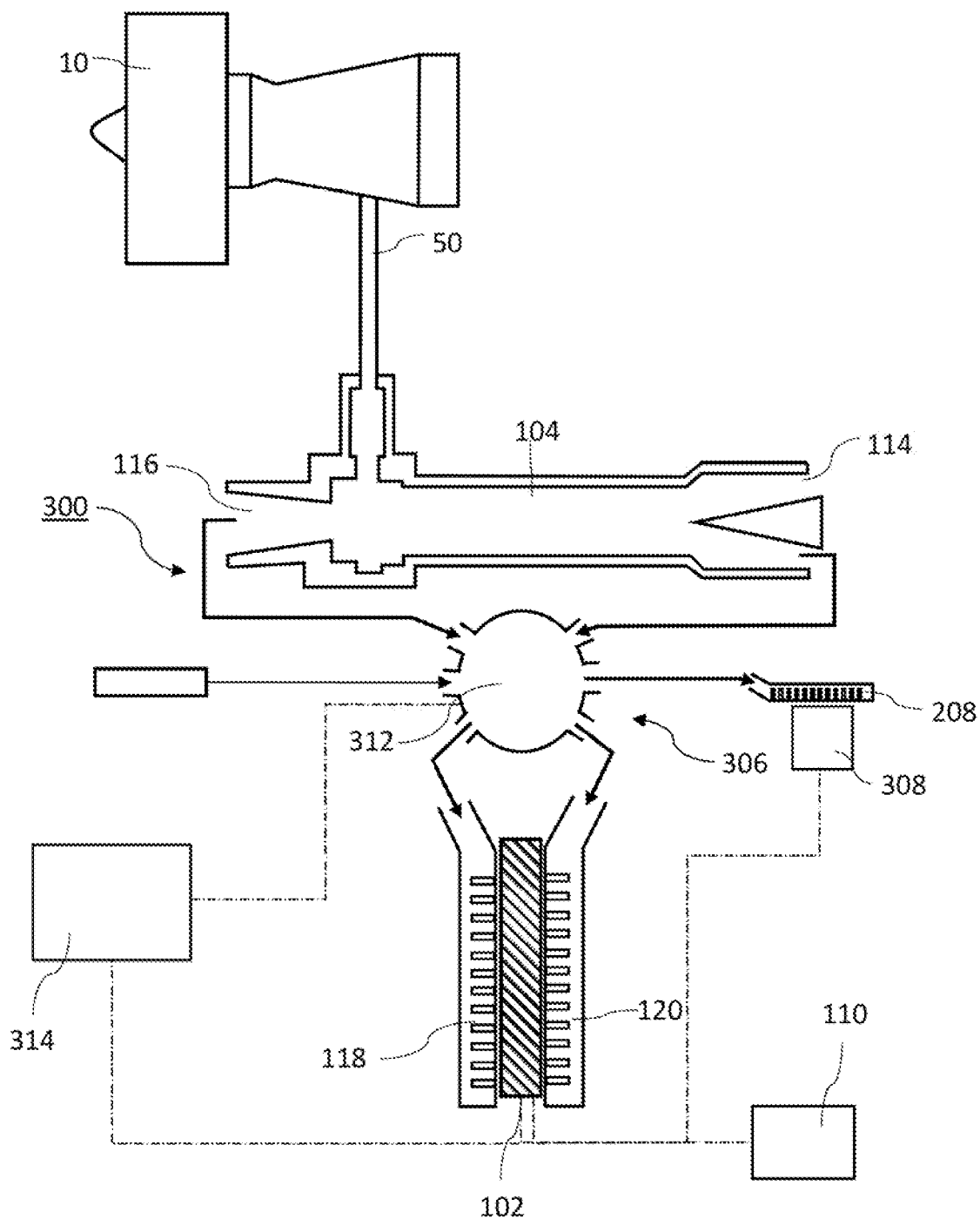
FIG. 4 schematically shows a third example thermoelectric generator system in the gas turbine engine.

FIG. 4 shows the gas turbine engine 10 comprising a third example thermoelectric generator system 300 connected to the compressor stage via a bleed air line 50 which is diverted from the compressor stage of the gas turbine engine 10.

The third example thermoelectric generator system 300 is similar to the first example thermoelectric generator system 100 described with reference to FIG. 2 and the second example thermoelectric generator system 200 described with reference to FIG. 3, with like reference numerals denoting like components.

The third example thermoelectric generator system 300 differs from the first example thermoelectric generator system 100 and the second example thermoelectric generator system 200 in that the electronic components comprise a sensor system 308 which is configured to determine a first parameter, $T_H$, a second parameter, $T_C$, and a third parameter, $T_3$. The first parameter is indicative of a temperature of the hot flow at, or upstream of, the first output 114 of the vortex tube 104, the second parameter is indicative of a temperature of the cold flow at the second output 116 of the vortex tube 104, and the third parameter is indicative of a temperature of a third fluid flow. One or more component heat exchangers 208 are associated with the sensor system 308 in a similar way to the component heat exchanger 208 and the sensor 108 in the second example thermoelectric generator system 200. In other examples, there may additionally be any other sensors 108, such as in the first and second example thermoelectric generator systems 100, 200.

The third example thermoelectric generator system 300 also differs from the first example thermoelectric generator system 100 and the second example thermoelectric generator system 200 in that it has a different radiator system 306.

The radiator system 306 in this example still comprises a first heat exchanger 120 and a second heat exchanger 118 which are disposed on opposing sides of the thermoelectric generator 102. In this example, the radiator system 306 further comprises a tube system which is configured to separately direct the hot flow, the cold flow and the third fluid flow towards a switch arrangement 312 upstream of the second heat exchanger 118 and the first heat exchanger 120.

In this example, the third fluid flow is ambient air which may be derived directly from the surroundings, such as around the vortex tube 104, around the sensor system 308, around the radiator system 306 or from any other suitable place. In other examples, the third fluid flow may be a bleed air flow derived from the bleed air line.

Figure 5:
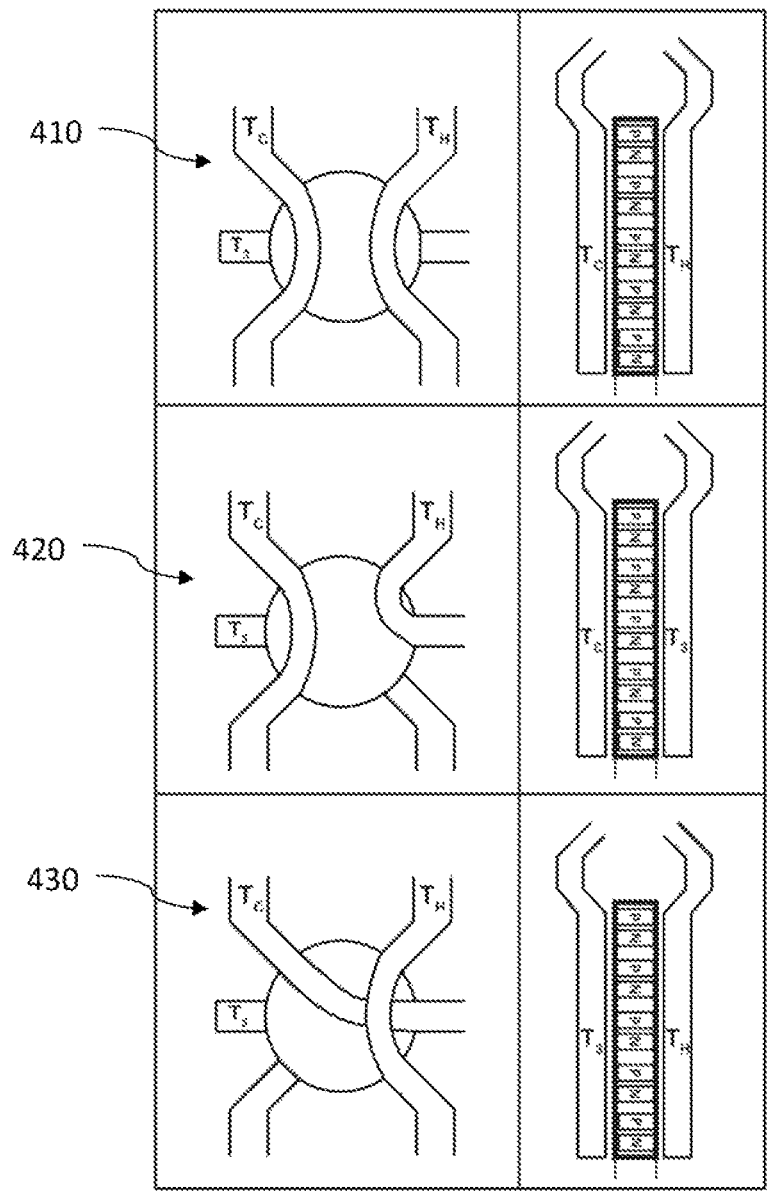
FIG. 5 schematically shows three configurations of a switch arrangement of the third example thermoelectric generator system of FIG. 4.

The switch arrangement 312 is configured to receive each of the hot flow, the cold flow and the third fluid flow, and to be moveable between a first configuration, a second configuration and a third configuration, which are shown in more detail with reference to FIG. 5.

The thermoelectric generator system 300 comprises a control unit 314 which is configured to control the switch arrangement 312 to move to any one of the first configuration, the second configuration and the third configuration based on the first parameter, the second parameter and the third parameter, which the control unit 314 is configured to receive from the sensor system 308. The first parameter, the second parameter and the third parameter may be communicated wirelessly to the control unit 314, or through a wired connection.

Figure 6:
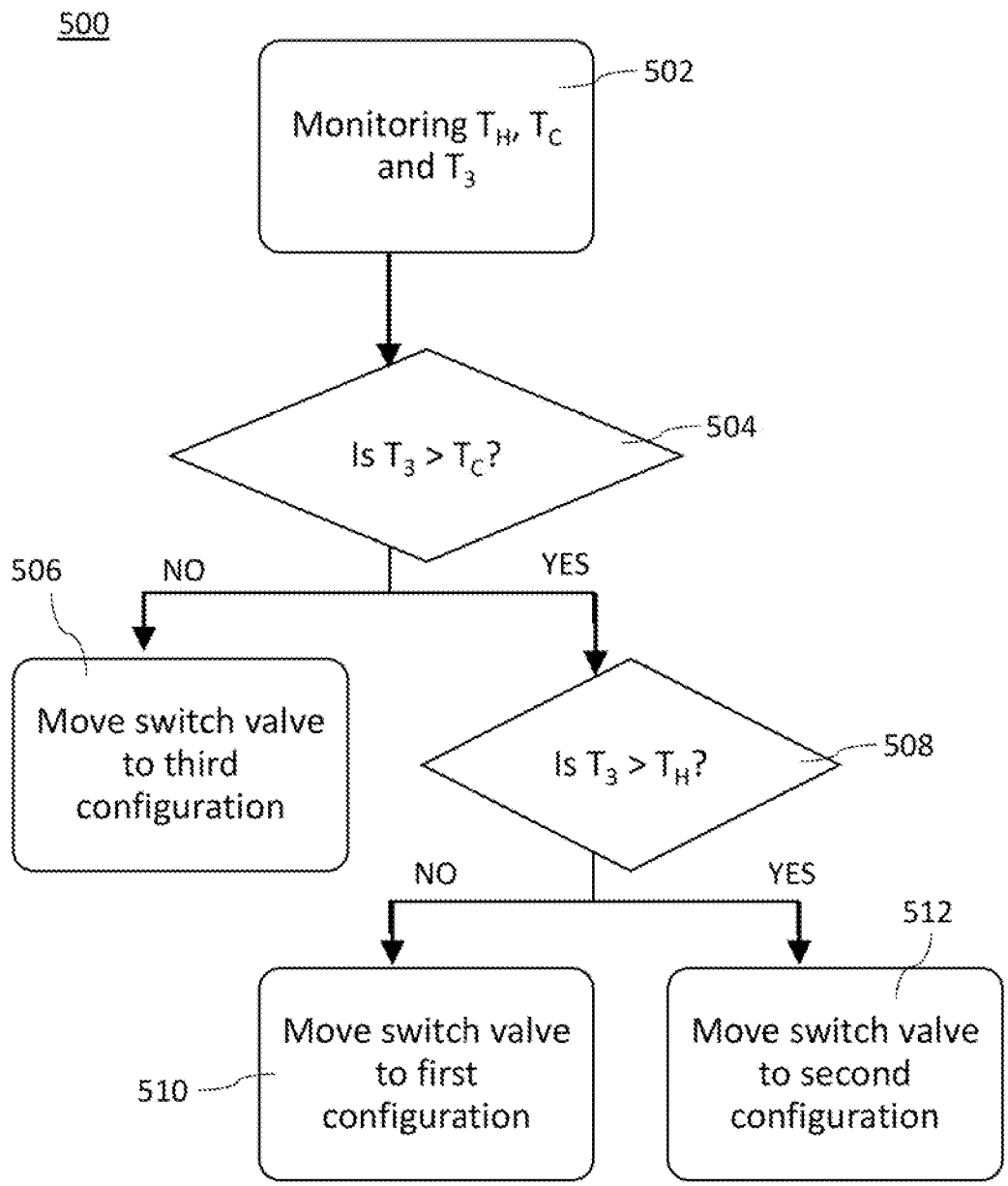
FIG. 6 is a flow chart showing steps of a method of controlling the third example thermoelectric generator system of FIG. 4.

The control unit 314 may comprise any suitable circuitry to cause performance of the methods described herein and as illustrated in FIG. 6. The control unit 314 may comprise: control circuitry; and/or processor circuitry; and/or at least one application specific integrated circuit (ASIC); and/or at least one field programmable gate array (FPGA); and/or single or multi-processor architectures; and/or sequential/parallel architectures; and/or at least one programmable logic controllers (PLCs); and/or at least one microprocessor; and/or at least one microcontroller; and/or a central processing unit (CPU); and/or a graphics processing unit (GPU), to perform the methods.

In various examples, the control unit 314 may comprise at least one processor and at least one memory. The memory may store a computer program comprising computer readable instructions that, when read by the processor, causes performance of the methods described herein, and as illustrated in FIG. 6. The computer program may be software or firmware, or may be a combination of software and firmware.

The control unit 314 may be part of the thermoelectrical generator system 100 or a remote computer (such as a high-performance computing cluster in the 'cloud'). Alternatively, the control unit 314 may be distributed between a plurality of devices and locations. For example, the control unit 314 may be distributed between the thermoelectric generator system 100 and a high-performance computing duster in the 'cloud'.

The processor may include at least one microprocessor and may comprise a single core processor, may comprise multiple processor cores (such as a dual core processor or a quad core processor), or may comprise a plurality of processors (at least one of which may comprise multiple processor cores). The memory may be any suitable non-transitory computer readable storage medium, data storage device or devices, and may comprise a hard disk and/or solid-state memory (such as flash memory). The memory may be permanent non-removable memory or may be removable memory (such as a universal serial bus (USB) flash drive or a secure digital card). The memory may include: local memory employed during actual execution of the computer program; bulk storage; and cache memories which provide temporary storage of at least some computer readable or computer usable program code to reduce the number of times code may be retrieved from bulk storage during execution of the code.

The computer program may be stored on a non-transitory computer readable storage medium. The computer program may be transferred from the non-transitory computer readable storage medium to the memory. The non-transitory computer readable storage medium may be, for example, a USB flash drive, an external hard disk drive, an external solid-state drive, a secure digital (SD) card, an optical disc (such as a compact disc (CD), a digital versatile disc (DVD) or a Blu-ray disc). In some examples, the computer program may be transferred to the memory via a signal (which may be a wireless signal or a wired signal). Input/output devices may be coupled to the controller 14 either directly or through intervening input/output controllers. Various communication adaptors may also be coupled to the controller 14 to enable the apparatus 10 to become coupled to other apparatus or remote printers or storage devices through intervening private or public networks. Non-limiting examples include modems and network adaptors of such communication adaptors.

In this example, the thermoelectric generator 102 is electrically connected to the control unit 314, the sensor system 308 and an energy storage component 110 so that the control unit 314, the sensor system 308 and the energy storage component 110 are powered by the thermoelectric generator 102. In other examples, the sensor system 308, the energy storage component 110 and the control unit 314 may be powered by other means and/or there may be additional or alternative electronic components which are powered by the thermoelectric generator 102.

FIG. 5 shows the switch arrangement in the first configuration 410, the second configuration 420 and the third configuration 430.

In the first configuration, the cold flow having a temperature, $T_C$, from the vortex tube 104 is directed to the second heat exchanger 118, and the hot flow having a temperature, $T_H$, from the vortex tube 104 is directed to the first heat exchanger 120. The third fluid flow, having a temperature $T_3$, and/or the cold flow after passing through the second heat exchanger 118 may be directed to the component heat exchanger 208 to cool the sensor system 308. In other examples, the third fluid flow may be stopped with a valve, so that it is not used or may be returned to a source after cooling the sensor system 308 and any other electronic components.

In the second configuration, the cold flow having a temperature, $T_C$, from the vortex tube 104 is directed to the second heat exchanger 118 and the third fluid flow having a temperature, $T_3$, from the vortex tube 104 is directed to the first heat exchanger 120. The hot flow having a temperature, $T_H$, may be directed back to the bleed air line 50. In some examples, the cold flow may be used to cool the sensor system 308 after it has passed through the second heat exchanger 118 and/or may be directed back to the bleed air line 50.

In the third configuration, the third fluid flow having a temperature, $T_3$, is directed to the second heat exchanger 118 and the hot flow having a temperature, $T_H$, from the vortex tube 104 is directed to the first heat exchanger 120. The cold flow having a temperature, $T_C$, and/or the third fluid flow after passing through the cold heat exchanger 118 may be directed to the component heat exchanger 208 to cool the sensor system 308. In other examples, the cold flow may be directed back to the bleed air line 50 or the cold flow may be stopped with a valve.

In this example, the switch arrangement 312 may be a single solenoid valve which is capable of managing the flows in the three configurations, or may comprise multiple valves to achieve the flow management in the three configurations.

FIG. 6 is a flow chart showing steps of a method 500 for controlling the thermoelectric generator system 300.

In block 502, the method 500 comprises monitoring the first parameter, $T_H$, the second parameter, $T_C$, and the third parameter $T_3$, for example with the sensor system 308. The parameters, $T_H$, $T_C$, $T_3$ may be sent to the control unit 314 or may be processed with a processor within the sensor system 308.

In block 504, the method 500 comprises determining if the third parameter $T_3$ and the second parameter $T_C$ indicate that the temperature of the third fluid flow is higher than the temperature of the cold flow. Since the temperature of the hot flow $T_H$ will always be higher than the temperature of the cold flow $T_C$, if block 504 returns NO, then:

$$T_H > T_C > T_3$$

block 504 returns NO, the method 500 moves to block 506 in which the control unit 314 controls the switch arrangement 312 to move to the third configuration, such that the hot flow (having the highest temperature) is delivered to the first heat exchanger 120 and the third flow (having the lowest temperature) is delivered to the second heat exchanger 118, such that the possible thermal gradient across the thermoelectric generator 102 is maximised, thereby maximising the potential difference generated by the thermoelectric generator 102.

The cold flow in this configuration may be directed to the component heat exchanger 208 to cool the sensor system 308 and/or any other electronic components which are powered by the thermoelectric generator 102. In other examples, the cold flow may be directed to a heat exchanger to cool any suitable components, powered by other means and unpowered. In yet other examples, the cold flow may be directed back to the bleed air line 50 in the gas turbine engine 10. In some examples, the cold flow and the hot flow may be returned to the bleed air line 50 if the compressed air is supplied to the vortex tube 104 from the bleed air line 50.

If block 504 returns YES, the method 500 moves to block 508 in which the method 500 comprises determining if the third parameter $T_3$ and the first parameter $T_H$ indicate that the temperature of the third fluid flow is higher than the temperature of the hot flow. Since the temperature of the hot flow $T_H$ will always be higher than the temperature of the cold flow $T_C$, if block 506 returns NO, then:

$$T_H > T_3 > T_C$$

If block 506 returns NO, the method 500 moves to block 510 in which the control unit 314 controls the switch arrangement 312 to move to the first configuration, such that the hot flow (having the highest temperature) is delivered to the first heat exchanger 120 and the cold flow (having the lowest temperature) is delivered to the second heat exchanger 118, such that the possible thermal gradient across the thermoelectric generator 102 is maximised, thereby maximising the potential difference generated by the thermoelectric generator 102.

The third fluid flow in this configuration may be directed to the component heat exchanger 208 to cool the sensor system 308 and/or any other electronic components which are powered by the thermoelectric generator 102. In other examples, the third fluid flow may be directed to a heat exchanger to cool any suitable components, powered by other means and unpowered. In yet other examples, the third fluid flow may be directed to the bleed air line 50 in the gas turbine engine 10 or stopped with a valve so that it does not leave the bleed air line 50 if it is air from the bleed air line 50. The cold flow may also be directed to the component heat exchanger 208 after passing through the second heat exchanger 118. In some examples, the cold flow and the hot flow may be returned to the bleed air line 50 if the compressed air is supplied to the vortex tube 104 from the bleed air line 50.

If block 506 returns YES, since the temperature of the hot flow $T_H$ will always be higher than the temperature of the cold flow $T_C$, then:

$$T_3 > T_H > T_C$$

If block 506 returns YES, the method 500 moves to block 512 in which the control unit 314 controls the switch arrangement 312 to move to the second configuration, such that the third flow (having the highest temperature) is delivered to the first heat exchanger 120 and the cold flow (having the lowest temperature) is delivered to the second heat exchanger 118, such that the possible thermal gradient across the thermoelectric generator 102 is maximised, thereby maximising the potential difference generated by the thermoelectric generator 102.

The hot flow in this configuration may be directed back to the bleed air line 50 in the gas turbine engine 10. In other examples, the hot flow may be directed to the component heat exchanger 208 to cool the sensor system 308 and/or any other electronic components which are powered by the thermoelectric generator 102. The cold flow may additionally or alternatively be directed to the component heat exchanger 208 after passing through the second heat exchanger 118. In some examples, the cold flow and the hot flow may be returned to the bleed air line 50 if the compressed air is supplied to the vortex tube 104 from the bleed air line 50.

It can be seen that the method 500 therefore controls the configuration of the switch arrangement 312 based on the first parameter, the second parameter and the third parameter. In this method, it ensures that the highest temperature difference is used in the flows through the first heat exchanger 120 and the second heat exchanger 118 to ensure the maximum potential difference can be achieved across the thermoelectric generator 102.

The method 500 may also include directing the energy generated by the thermoelectric generator 102 to the control unit 314, the sensor system 308 and the energy storage component 110.

Although it has been described that the thermoelectric generator systems 100, 200, 300 are coupled to the compressor stage of a gas turbine engine 10, in other examples, the thermoelectric generator system 100 may be supplied with compressed air from any suitable source, and references to a bleed air line may be replaced by any air source line. For example, the thermoelectric generator system may be used outside of, and without, a gas turbine engine, with any suitable supply of compressed air.

Although it has been described that the second heat exchanger 118 and the first heat exchanger 120 of the radiator system 106 are configured to receive the cold flow and the hot flow respectively from the vortex tube 104, one of the first heat exchanger and the second heat exchanger may simply be a hot surface or a cold surface respectively.

It will be understood that the disclosure is not limited to the embodiments above-described and various modifications and improvements can be made without departing from the concepts described herein. Except where mutually exclusive, any of the features may be employed separately or in combination with any other features and the disclosure extends to and includes all combinations and sub-combinations of one or more features described herein.

We claim:

1. A thermoelectric generator system comprising:
a thermoelectric generator;
a vortex tube comprising a flow input configured to receive an input of compressed gas and to separate the compressed gas into a hot flow discharged from a first output of the vortex tube, and a cold flow discharged from a second output of the vortex tube;
a sensor system configured to determine a first parameter indicative of a temperature of the hot flow, a second parameter indicative of a temperature of the cold flow and a third parameter indicative of a temperature of a third fluid flow;
a radiator system comprising:
a first heat exchanger and a second heat exchanger disposed on opposing sides of the thermoelectric generator; and
a tube system configured to separately direct the hot flow, the cold flow and the third fluid flow towards a switch arrangement, wherein the switch arrangement is configured to receive each of the hot flow, the cold flow and the third fluid flow, and to be moveable between:
a first configuration in which the cold flow is directed to the second heat exchanger and the hot flow is directed to the first heat exchanger;
a second configuration in which the cold flow is directed to the second heat exchanger and the third fluid flow is directed to the first heat exchanger; and
a third configuration in which the third fluid flow is directed to the second heat exchanger and the hot fluid is directed to the first heat exchanger;
the thermoelectric generator system further comprising a control unit configured to control the configuration of the switch arrangement based on the first parameter, the second parameter, and the third parameter.

2. The thermoelectric generator system according to claim 1, wherein the thermoelectric generator is electrically connected to the control unit, so that the control unit is powered by the thermoelectric generator.

3. The thermoelectric generator system according to claim 1, further comprising an energy storage component electrically connected to the thermoelectric generator to store energy generated by the thermoelectric generator that cannot be immediately consumed.

4. The thermoelectric generator system according to claim 1, wherein in the third configuration, the switch arrangement is configured to direct the cold flow to a component heat exchanger at an electronic component which is powered by the thermoelectric generator, to cool the electronic component.

5. The thermoelectric generator system according to claim 1, wherein the radiator system is configured so that fluid directed through the second heat exchanger is directed to a component heat exchanger at an electronic component which is powered by the thermoelectric generator, to cool the electronic component.

6. The thermoelectric generator system according to claim 1, wherein the control unit is configured to control the switch arrangement to move to the first configuration when the cold flow has a lower temperature than the third fluid flow.

7. The thermoelectric generator system according to claim 6, wherein the control unit is configured to control the switch arrangement to move to the first configuration when the third fluid flow has a lower temperature than the hot flow.

8. The thermoelectric generator system according to claim 1, wherein the control unit is configured to control the switch arrangement to move to the second configuration when the hot flow has a lower temperature than the third fluid flow.

9. The thermoelectric generator system according to claim 8, wherein the control unit is configured to control the switch arrangement to move to the second configuration when the third fluid flow has a higher temperature than the cold flow.

10. The thermoelectric generator system according to claim 1, wherein the control unit is configured to control the switch arrangement to move to the third configuration when the third fluid flow has a lower temperature than the cold flow.

11. A gas turbine engine including the thermoelectric generator system according to claim 1.

12. A method of controlling a thermoelectric generator system comprising:
a thermoelectric generator;
a vortex tube comprising a flow input configured to receive an input of compressed gas and to separate the compressed gas into a hot flow discharged from a first output of the vortex tube, and a cold flow discharged from a second output of the vortex tube;
a sensor system configured to determine a first parameter indicative of a temperature of the hot flow, a second parameter indicative of a temperature of the cold flow and a third parameter indicative of a temperature of a third fluid flow;
a radiator system comprising:
  a first heat exchanger and a second heat exchanger disposed on opposing sides of the thermoelectric generator; and
  a tube system configured to separately direct the hot flow, the cold flow and the third fluid flow towards a switch arrangement, wherein the switch arrangement is configured to receive each of the hot flow, the cold flow and the third fluid flow, and to be moveable between:
    a first configuration in which the cold flow is directed to the second heat exchanger and the hot flow is directed to the first heat exchanger;
    a second configuration in which the cold flow is directed to the second heat exchanger and the third fluid flow is directed to the first heat exchanger; and
    a third configuration in which the third fluid flow is directed to the second heat exchanger and the hot fluid is directed to the first heat exchanger;
the thermoelectric generator system further comprising a control unit configured to control the configuration of the switch arrangement based on the first parameter, the second parameter, and the third parameter, the method comprising:
monitoring a parameter indicative of the temperature of the hot flow, the cold flow and the third fluid flow with the sensor system to determine the first parameter, the second parameter and the third parameter respectively; and
controlling the configuration of the switch arrangement based on the first parameter, the second parameter and the third parameter.

13. The method according to claim 12, comprising powering the control unit with the thermoelectric generator.

14. The method according to claim 12, further comprising directing the energy generated by the thermoelectric generator that cannot be immediately consumed to an energy storage component.

15. The method according to claim 12, wherein fluid which has passed through the second heat exchanger is directed to the component heat exchanger at the electronic component which is powered by the thermoelectric generator, to cool the electronic component.

16. The method according to claim 12, comprising controlling the switch arrangement to move to the first configuration when the cold flow has a lower temperature than the third fluid flow.

17. The method according to claim 16, comprising controlling the switch arrangement to move to the first configuration when the third fluid flow has a lower temperature than the hot flow.

18. The method according to claim 12, comprising controlling the switch arrangement to move to the second configuration when the hot flow has a lower temperature than the third fluid flow.

19. The method according claim 18, comprising controlling the switch arrangement to move to the second configuration when the third fluid flow has a higher temperature than the cold flow.

20. The method according to claim 12, comprising controlling the switch arrangement to move to the third configuration when the third fluid flow has a lower temperature than the cold flow.

* * * * *